United States Patent
Budin et al.

(10) Patent No.: US 8,312,346 B2
(45) Date of Patent: Nov. 13, 2012

(54) SYSTEMS AND METHODS FOR COMMUNICATIONS

(75) Inventors: Dan Budin, Newton, MA (US); Mehmet Aydinlik, Hyde Park, MA (US)

(73) Assignee: Mirics Semiconductor Limited (GB)

( * ) Notice: Subject to any disclaimer, the term of this patent is extended or adjusted under 35 U.S.C. 154(b) by 767 days.

(21) Appl. No.: 12/434,325

(22) Filed: May 1, 2009

(65) Prior Publication Data

US 2010/0281334 A1 Nov. 4, 2010

(51) Int. Cl.
G06F 11/00 (2006.01)
(52) U.S. Cl. .................................. 714/755; 714/756
(58) Field of Classification Search ............ 714/755, 714/756, 752, 784, 785, 795
See application file for complete search history.

(56) References Cited

U.S. PATENT DOCUMENTS

| | | | |
|---|---|---|---|
| 4,958,349 A | 9/1990 | Tanner et al. | |
| 5,889,823 A * | 3/1999 | Agazzi et al. | 375/341 |
| 6,263,470 B1 | 7/2001 | Hung et al. | |
| 6,298,461 B1 | 10/2001 | Tong et al. | |
| 6,314,447 B1 | 11/2001 | Lea et al. | |
| 6,360,348 B1 | 3/2002 | Yang | |
| 6,453,109 B1 | 9/2002 | Yamamoto | |
| 6,529,988 B1 | 3/2003 | Yoshikawa et al. | |
| 6,629,287 B1 * | 9/2003 | Brink | 714/755 |
| 6,967,598 B2 * | 11/2005 | Mills | 341/50 |
| 7,016,308 B1 | 3/2006 | Gallagher | |
| 7,239,668 B2 * | 7/2007 | De Gaudenzi et al. | 375/279 |
| 2002/0097818 A1 * | 7/2002 | Hagenauer et al. | 375/341 |
| 2003/0142764 A1 | 7/2003 | Keevill et al. | |
| 2004/0261002 A1 * | 12/2004 | Eidson et al. | 714/786 |
| 2005/0097616 A1 | 5/2005 | Numata | |
| 2006/0046716 A1 | 3/2006 | Hofstaedter et al. | |
| 2007/0067606 A1 | 3/2007 | Lin et al. | |
| 2008/0106652 A1 | 5/2008 | Magnusen et al. | |
| 2008/0177895 A1 | 7/2008 | Laprade et al. | |
| 2008/0276261 A1 | 11/2008 | Munshi et al. | |
| 2009/0106637 A1 | 4/2009 | Kim et al. | |
| 2009/0217286 A1 | 8/2009 | Schmidbauer et al. | |

FOREIGN PATENT DOCUMENTS

| | | |
|---|---|---|
| EP | 0138078 | 4/1985 |
| EP | 0793365 | 9/1997 |
| EP | 1404060 | 3/2004 |
| EP | 1 047 217 A2 | 10/2010 |
| GB | 2412551 | 9/2005 |
| GB | 2431309 | 4/2007 |
| GB | 2433372 | 6/2007 |
| JP | 2003296036 | 10/2003 |
| WO | WO91/05436 | 4/1991 |

(Continued)

OTHER PUBLICATIONS

Examination Reported dated Feb. 5, 2010 from corresponding Great Britain Application No. 0919151.1.

(Continued)

*Primary Examiner* — Dieu-Minh Le
(74) *Attorney, Agent, or Firm* — McDermott Will & Emery LLP

(57) ABSTRACT

Systems, methods, and an article of manufacture for performing serial concatenated decoding are shown and described. The decoding includes monitoring a measure of the number of corrections made to a plurality data blocks during outer decoding and determining whether applying sub-optimal inner decoding would reduce a computational load experienced by a processor performing the serial concatenated decoding when compared to the computation load experienced by the processor when optimal inner decoding is applied.

28 Claims, 5 Drawing Sheets

FOREIGN PATENT DOCUMENTS

| WO | WO01/15443 | 3/2001 |
|---|---|---|
| WO | WO01/54300 | 7/2001 |
| WO | WO2004/082189 | 9/2004 |
| WO | WO2009/144436 | 12/2009 |
| WO | WO2009/144437 | 12/2009 |
| WO | WO2009/144438 | 12/2009 |

OTHER PUBLICATIONS

Matolak, David W., et al., Variable-Complexity Trellis Decoding of Binary Convolutional Codes, IEEE Transactions on Communications, vol. 44, No. 2, Feb. 1996, pp. 121-126.

Dhar et al., "Supporting Integrated MAC and PHY Software Development for the USRP SDR," Networking Technologies for Software Defined Radio Networks, IEEE Workshop on Sep. 25, 2006.

ISR & WO for PCT/GB2009/000031.

ISR & WO for PCT/GB2009/000036.

ISR & WO for PCT/GB2009/000046.

Kabatiansky et al., "Error Correcting Coding and Security for Data Networks: Analysis of the Superchannel Concept," 290 pages (2005).

Matolak et al., "Variable-Complexity Trellis Decoding of Binary Convolutional Codes," IEEE Transactions on Communications, 44:121-126 (1996).

Mirics Semiconductor, "Mirics FlexiTV™ Optimized for CUDA," PowerPoint Presentation by Mirics Semiconductor Inc., Global Broadcast Reception for PCs, netbooks, MIDs and Smartphones, p. 1-21 (2009).

Quinn. "Gnu Radio Opens in Unseen World," XP-002525001, 2 pages (2006).

Szegvari et al., "An Universal Framework for Scalable Software Defined or Cognitive Radios Running on Desktop Computers", Proceedings of the SDR '09 Technical Conference and Product Exposition, SDR Forum, Inc., 6 pgs, (2009).

Zhi et al: "Spectrum Sensing, Access and Coexistence Testbed for Cognitive Raio using USRP" 10 pages.

\* cited by examiner

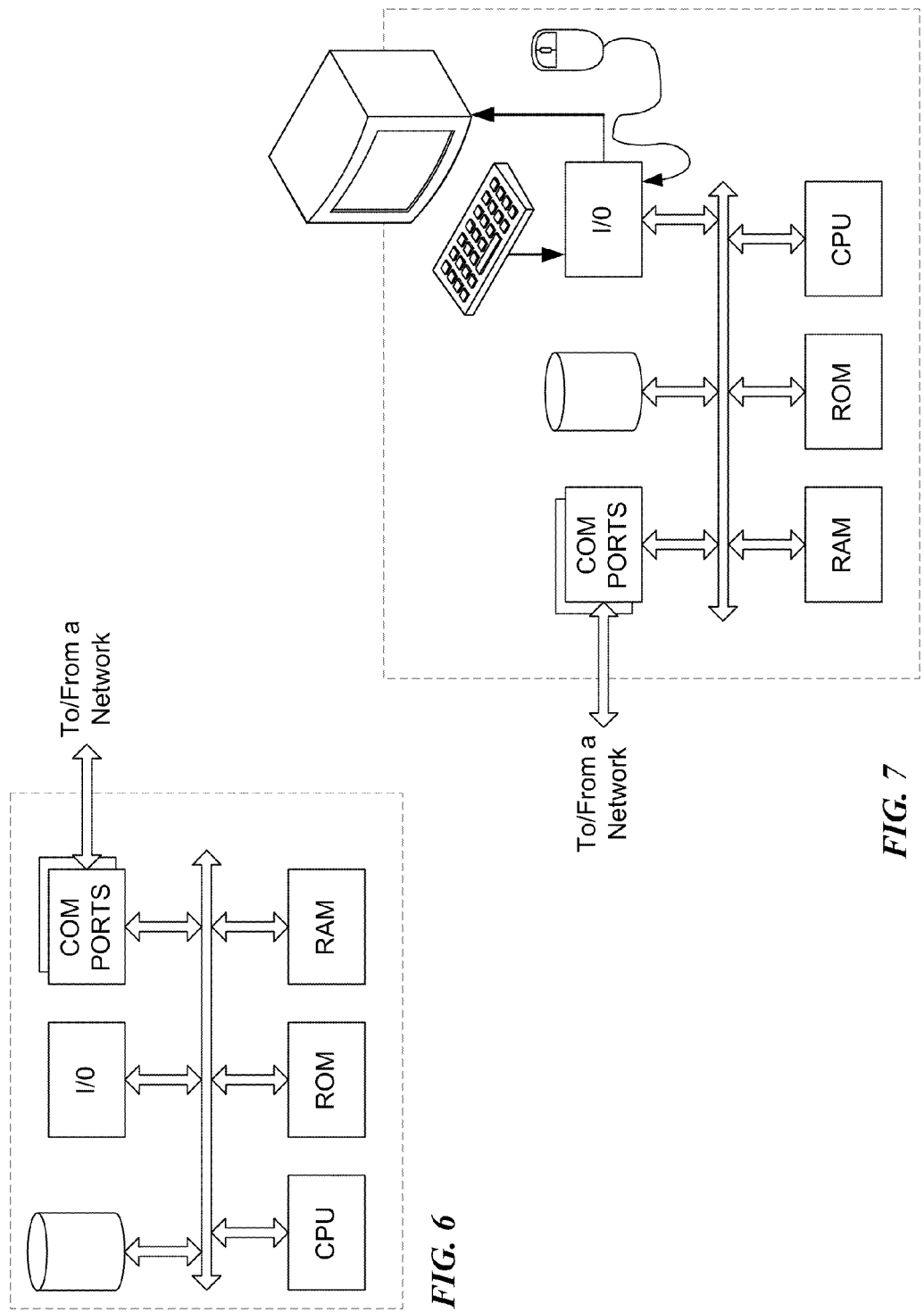

SYSTEMS AND METHODS FOR COMMUNICATIONS

TECHNICAL FIELD

The present subject matter relates to techniques and equipment for communications systems. In more detail, it relates to techniques and equipment for decoding data.

BACKGROUND

Serial concatenated decoding typically involves two decoders connected in series. The first decoder is typically called the inner decoder and the second decoder is called the outer decoder. Serial concatenated decoding lends itself to many uses. One example is recovering information bits from a code word.

In a more specific example, the digital video broadcast terrestrial standard uses serial concatenated encoding at the transmitter. The transmitter includes a non-binary block code (e.g., a Reed-Solomon (RS) code) followed by a punctured convolution code (often referred to as forward error correction). In order to view the broadcast, the receiver uses serial concatenated decoding. A typical implementation uses a Viterbi decoder as the inner decoder and a Reed-Solomon decoder as the outer decoder.

In some instances, a set-box or television includes the receiver functionality. However, other manufactures are developing integrated circuits that can transform a personal computer into a dvb-t receiver. For example, a consumer can purchase a USB attachable receiver that allows the consumer to receive and view terrestrial broadcasts on their personal computer.

In such a device, the processor of the personal computer is often leveraged to provide certain receiver functionality. For example, the processor of the personal computer can be used to provide some or all of the decoding operations. As result, the availability of the processor of the personal computer for performing other tasks is adversely impacted.

SUMMARY

In one example, the present disclosure is directed to a system, method, and article of manufacture for performing serial concatenated decoding. Using a sub-optimal inner decoder reduces the processing load experienced by the processing element when compared to performing optimal inner decoding. Thus, the processor can perform additional tasks that may not be related to decoding.

In one aspect, the disclosure is directed to a method of performing serial concatenated decoding having inner decoding and outer decoding. The method includes monitoring a measure of the number of corrections made to a plurality data blocks during outer decoding and determining whether applying sub-optimal inner decoding would reduce a computational load experienced by a processor performing the serial concatenated decoding when compared to the computation load experienced by the processor when optimal inner decoding is applied. The method also includes applying, by the processor, sub-optimal inner decoding on data being serially concatenated decoded when the determination indicates that the processing load experienced is reduced.

In various other examples, the method can also include temporarily applying optimal inner decoding to a portion of the data blocks previously decoded with the sub-optimal decoding. This redecoding occurs in response to an indication that an output of the outer decoding contains an error. The method can also include monitoring the byte error rate of an output of the inner decoding. Deinterleaving the output of the inner decoder can also be included in the method.

In some examples, the outer decoder is a Reed-Solomon decoder implementing a Reed-Solomon decoding algorithm. Various optimal and sub-optimal inner decoding pairs can be implemented as part of the system and methods. For example, the optimal inner decoding can include applying a sixty-four state Viterbi decoding while the sub-optimal inner decoding can include applying a thirty-two state Viterbi decoding. Another example includes an optimal inner decoding that applies log-MAP turbo decoding algorithm while the sub-optimal inner decoding includes applying a max-log-MAP turbo decoding algorithm. Yet another example includes having sub-optimal inner decoding that applying a LDPC decoding with a reduced number of iterations when compared to the number of iterations of optimal LDPC inner decoding In another example, the disclosure is directed to a system for performing serial concatenated decoding. The system includes a selector, an optimal inner decoder, a sub-optimal inner decoder, and an outer decoder. The selector has an input and a plurality of outputs. The optimal inner decoder has an output and an input in communication with a first selector output. The sub-optimal inner decoder has an output and an input in communication with a second selector output. The outer decoder is in communication with the output of each of the optimal inner decoder and sub-optimal inner decoder. The outer decoder has an output in communication with the selector that determines whether the optimal inner decoder or sub-optimal inner decoder receives data for decoding based on monitoring a measure of the number of corrections made to a plurality of blocks of data during operation of the outer decoder.

The apparatus, system, and method of the present disclosure can be used to decode many types of signals and data. For example, audio signals can be decoded. Also, video signals can be decoded. Of course, combined audio and video signals can be decoded Thus, the apparatus, system, and method described herein can be used in television applications, audio applications, wireless communication applications (e.g., cellular telephones, wireless networking, and so on), networking applications, and other applications.

In one example, the disclosure features various form-factors that implement the decoding described herein. In one example, a decoder includes a processor (e.g., located in a set-top box) and associated software being executed by the software. In another example, the processor is located in cellular telephone and that the associated software is executed by the telephone. Of course, radios can include a processor that executes the associated software.

Other concepts relate to unique software for implementing serial concatenated decoding. A software product, in accord with this concept, includes at least one machine readable medium and information carried by the medium. The information carried by the medium may be executable program code.

In another example, the disclosure relates to an article of manufacture. The article includes a machine readable storage medium and executable program instructions embodied in the machine readable storage medium that when executed by a programmable system causes the system to perform functions of serial concatenated decoding having inner decoding and outer decoding. The functions include monitoring a measure of the number of corrections made to a plurality data blocks during outer decoding and determining whether applying sub-optimal inner decoding would reduce a computational load experienced by a processor of the programmable system performing the serial concatenated decoding when compared to the computation load experienced by the processor when optimal inner decoding is applied. The functions also include applying, by the processor, sub-optimal inner decoding on data being serially concatenated decoded when the determination indicates that the processing load experienced is reduced.

BRIEF DESCRIPTION OF THE DRAWINGS

The drawing figures depict one or more implementations in accord with the present teachings, by way of example only, not by way of limitation. In the figures, like reference numerals refer to the same or similar elements.

FIG. 6 is a simplified functional block diagram of a computer that may be configured as a host or server.

FIG. 7 is a simplified functional block diagram of a personal computer or other work station or terminal device.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The various examples disclosed herein relate systems, method, and articles of manufacture for performing serial concatenated decoding. The serial concatenated decoding described herein reduces, in some instances, the processing load experience by a processor when compared to other serial concatenated decoding systems. This reduction in load frees the processing resources to perform other tasks while decoding data.

Figure 1:
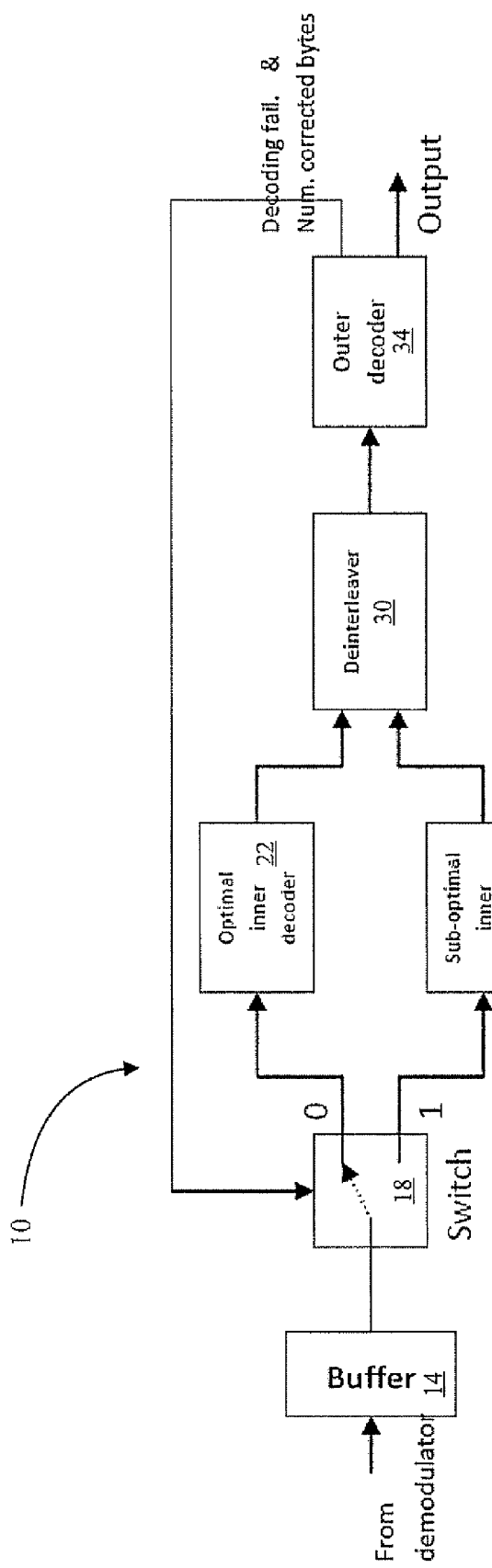
FIG. 1 is a functional block diagram of an embodiment of a system for performing serial concatenated decoding.

Reference now is made in detail to the examples illustrated in the accompanying drawings and discussed below. FIG. 1 depicts an embodiment of a system 10 for performing serial concatenated decoding. The system 10 includes a buffer 14, a selector 18, an optimal inner decoder 22, a sub-optimal inner decoder 26, a deinterleaver 30, and an outer decoder 34.

The buffer 14 is in communication with a demodulator (not shown) and the selector 18. The buffer 14 is in essence memory that stores blocks of data received from the demodulator. The data blocks represent the received signals of television broadcast in one example. The buffer 14 can be located within the memory of the computing device (e.g., personal computer) as shown in FIG. 6 and FIG. 7 that is performing the decoding. The buffer 14 can be random access memory (RAM) and the like.

The storage size of the buffer 14 is selected, in one example, to be equal to the sum of the delays (expressed in terms of decoding blocks) for deinterleaver 30 and inner decoder 22, 26. Of course, the buffer 14 can be larger or smaller depending on the application. In one example, assume that the delay for the inner decoders 22, 26 is one data block. Storing the data blocks for a period of time allows for redecoding of certain data blocks as required. For example, if sub-optimal inner decoding is originally applied to a number of data blocks, it is possible that the output of the outer decoder will indicate an error. In such a case, all or some of the data blocks that were previously decoded using sub-optimal inner decoder 26 are retrieved from the buffer 14 and redecoded using the optimal inner decoder 22. Further details of redecoding are described below.

The selector 18 is in communication with the buffer 14 and both the optimal inner decoder 22 and the sub-optimal inner decoder 26. The selector 18 provides a mechanism to select either optimal inner decoding be applied to the data blocks received from the buffer 14 or sub-optimal inner decoding be applied to the data blocks received from the buffer 14. In essence, the selector 18 operates as a switch to connect one of the inner decoders 22, 26 with the buffer 14. The selector 18 can take many forms including a flag in a software routine or a physical electronic circuit (e.g., a transistor or diode). Although the selector 18 is shown as having two states position 0 or position 1, it should be understand that more states are possible depending on the number of inner decoders that are present.

The optimal inner decoder 22 is in communication with the selector 18 and the deinterleaver 30. The connection to the selector 18 can be established periodically. Said another way, the connection to the selector 18 can be temporarily applied and removed as required. Further details of this operation are discussed below. As used herein optimal refers to decoding that places a greater load on the processing when compared to the sub-optimal inner decoder 26. The use of "optimal" as a modifier in no way connotes an absolute measure of perfection. It is merely used to indicate a degree of separation between the inner decoders. For example, if three inner decoders were used they could conceptual be thought of a good inner decoder, a better inner decoder, and the best inner decoder for a specific application. In such a case, the "best inner decoder" can be considered the optimal inner decoder 22. In some applications, the optimal inner decoder 22 is implemented in hardware. In other applications, the optimal inner decoder 22 is implemented in software. Also, combinations of software and hardware can be used.

In one example, the optimal inner decoder 22 is a Viterbi decoder. The Viterbi decoder has a number of states (e.g., sixty-four). The optimal inner decoder 22 applies, in this example, a Viterbi decoding algorithm to the blocks of data received from the buffer 14.

In another example, the optimal inner decoder 22 can be Low Density Parity Check (LDPC) decoder that implements a greater number of decoding iterations when compared to the sub-optimal decoder 26. The optimal inner decoder 22 can implement any of a number decoding algorithms. Examples include, but are not limited to, the belief propagation algorithm, the message passing algorithm and the sum-product algorithm. LDPC codes are also referred to as Gallagher codes.

In yet another example, the optimal inner decoder 22 is a turbo code decoder. In a specific example, the optimal inner decoder 22 implements a log-MAP turbo decoding algorithm. Of course other known turbo code decoding algorithms can be used.

The sub-optimal inner decoder 26 is in communication with the selector 18 and the deinterleaver 30. The connection to the selector 18 can be established periodically. Said another way, the connection to the selector 18 can be temporarily applied and removed as required. Further details of this operation are discussed below. As used herein sub-optimal refers to decoding that reduces that load on the processing when compared to the optimal inner decoder 22. The use of "sub-optimal" as a modifier in no way connotes an absolute measure. In some applications, the sub-optimal inner decoder 26 is implemented in hardware. In other applications, the sub-optimal inner decoder 26 is implemented in software. Also, combinations of software and hardware can be used.

In some applications, the sub-optimal inner decoder 26 is selected as a compliment to the optimal inner decoder 22. For example, if a sixty-four state Viterbi decoder is the optimal decoder 22 the sub-optimal inner decoder 26 is a Viterbi decoder having fewer states (e.g., thirty-two). In another example, if the optimal inner decoder 22 is a thirty-two state Viterbi decoder the sub-optimal inner decoder 26 can have sixteen states. In another example, a LDPC decoding algorithm having a reduced number of decoding iterations when compared to the optimal decoder 26 is used. Also, the sub-optimal inner decoder 26 can execute a max-log-MAP turbo decoding algorithm when the optimal inner decoder 22 is implementing a log-MAP turbo code decoding algorithm. Of course, various combinations of the optimal inner decoders 22 and sub-optimal inner decoders 26 can be used provided the sub-optimal inner decoder reduces the processing load experienced by the processor performing the decoding.

The deinterleaver 30 is in communication with the optimal inner decoder 22 and the sub-optimal inner decoder 26. The deinterleaver 30 receives the inner-decoded data and randomizes the error pattern within the inner-decoded data. In some applications, the inner decoders 22, 26 operate on produce as output bits of data. In such cases, the bits are converted to bytes prior to being operating on by the deinterleaver 30. In some examples, the deinterleaver 30 is a convolutional deinterleaver have a delay of more than one decoding block.

The outer decoder 34 is in communication with the deinterleaver 30. The outer decoder 34 is assumed to be able to correct a up to a specific number "B" of bytes. Said another way, the outer decoder 34 can accept an input having a maximum number of byte errors and successfully correct those errors. If the input to the outer decoder includes more than B errors, the output of the outer decoder 34 indicates a decoding failure. This indication is used, in some examples, to trigger a recoding with the optimal inner decoder 22 certain data blocks that were originally decoded using the sub-optimal inner decoder.

The outer decoder 34, in one example, is a Reed-Solomon (RS) decoder. The outer decoder 34 also indicates the number of corrections that it makes to the inner-decoded data. This measure of the number of corrections is used to determine whether optimal inner decoding or sub-optimal inner coding can be used by the system 10 without affecting the overall error performance of the system 10. Other decoders can be used as the outer decoder 34 provide it indicates, at a very high reliability, whether decoding failed or not. The output of the outer decoder 34 is decoded data.

One goal of the system 10 is to obtain identical error performance within a device employing the optimal inner-decoder, however, when channel conditions allow the sub-optimal inner decoder is employed at a lower computational load. This can be achieved by monitoring the error statistics and accurately predicting in both modes of operations (i.e., optimal and sub-optimal) whether the other mode offers a lower computational load experienced by the processor. Fast switching between modes can respond to varying channel conditions. Thus, in either mode output error performance is substantially uncompromised.

In operation, the above-described system 10 provides serial concatenated decoding of data blocks. As shown, the system can provide two modes of operation. The first mode is referred to as sub-optimal mode. And the second mode is referred to as the optimal mode. In optimal mode, the selector 18 remains in position 0 thus establishing a communications path that includes the buffer 14, the optimal inner decoder 22, the deinterleaver 30, and the outer decoder 34.

In the sub-optimal mode, the selector 18 is usually in position 1; however, it switches to position 0 when re-decoding is activated as a result of an outer decoder 34 failure. When operating in sub-optimal mode, a communications path is established between the buffer 14, the sub-optimal inner decoder 26, the deinterleaver 30 and outer decoder 34. However, if recoding is needed the selector 18 temporarily transitions to position 0 to "switch in" the optimal inner decoder 22. This enables certain data blocks to be redecoded. After the certain data blocks are redecoded, the selector returns to position 1 and the sub-optimal inner decoder 26 is switched back into the processing path.

Figure 2:
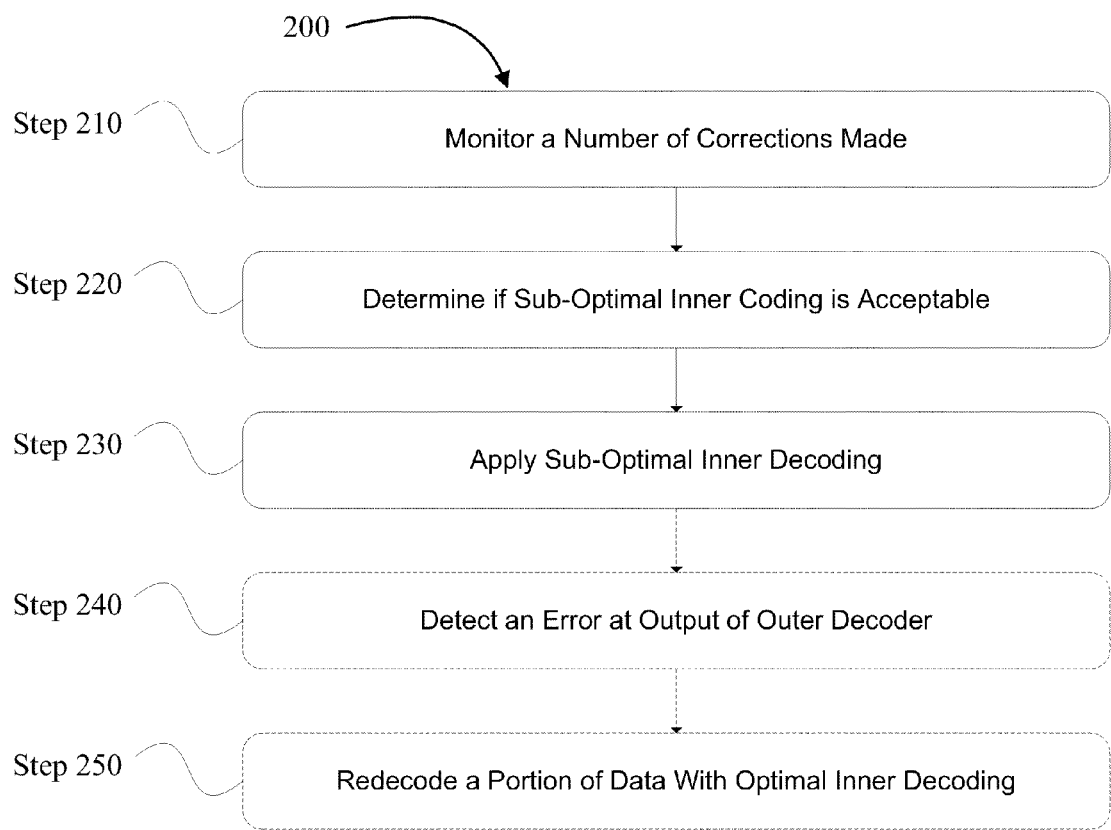
FIG. 2 is a flow chart depicting an embodiment of a method for performing serial concatenated decoding.

With reference to FIG. 2, a method 200 of performing serial concatenated decoding is shown and described. The method 200 includes monitoring (step 210) a number of correction made by the outer decoder 34, determining (step 220) whether sub-optimal inner coding is acceptable, and applying (step 230) sub-optimal inner coding. In some examples, the method also includes detecting (step 240) an error (e.g., a failure to decode) at the output of the outer decoder 34 and redecoding (step 250) a portion of the previously decoded data using optimal inner decoding.

In one example, assume the selector 18 begins in position 0 when decoding begins. After certain period of time, a measurement is taken based on the output of outer decoder 34 and a decision as to whether the selector should transition to position 1 is made. For example, if the corrected number of errors by outer decoder 34 during a period of time is less than a threshold, switch position can be changed to 1. Here, based on the corrected number of errors, it is estimated that sub-optimal inner decoder 26 can handle the decoding at a lower computation load when compared to the optimal inner decoder 22. Using the sub-optimal inner decoder 26 typically does not have an adverse affect on the output of the outer decoder 34. This is because the outer decoder can correct up to B errors. As long as the sub-optimal inner decoder 26 outputs blocks of data having less the B errors the outer decoder 34 can correct the blocks of data.

In another example, monitoring (step 210) the number of corrections made by the outer decoder 34 includes determining the byte error rate (ByER) measured at the input to the outer decoder 34. As stated above, assume that the outer decoder 34 can correct up to B bytes. If there are more than B byte errors at the input of outer decoder 34, the outer decoder would indicate a decoding failure. If decoding is successful, a number of corrected bytes is produced by outer decoder 34. In this example, the byte error rate (ByER) is estimated by monitoring the RS decoder feedback during the decoding of N blocks of data. Equation 1 depicts a measure of the ByER.

$$ByER = \frac{b + Nf*(B+1)}{N*Nb} \qquad (1)$$

In equation 1, $N_b$ denotes number of bytes in a decoding block after deinterleaver 30, and $N_f$ denotes the number of failed decoding blocks. Also, b denotes the number of corrected bytes during the period.

In one example, determining (step 220) whether sub-optimal inner coding is acceptable includes using the measured ByER to compute the computation cost (e.g., the load experienced by the processor of the computing element) associated with operating in that mode. The computational cost estimate is computed using a predetermined relationship between the byte error rates in each mode.

By way of example, in optimal mode the switch is locked in position 0, therefore measurement for optimal mode is denoted by $ByER_{sw0}$, where the subscript show the switch position. In sub-optimal mode, the switch may be in both positions 1 and 0, but ByER is measured when the switch is in position 1. Thus ByER for sub-optimal mode is denoted by $ByER_{sw1}$. In any mode, computational cost of being in that mode is computed from measurement in that mode. As previously noted, the cost estimate of being in the other mode can be computed well by using a pre-determined relation between $ByER_{sw0}$ and $ByER_{sw1}$. By exploiting this relationship, a decision about whether operating in sub-optimal mode reduces the processing load experienced by a processing element is reduced without adversely affecting the output of the outer decoder. Said another way, by monitoring the ByER a decision can be made to potentially increase the number of bit errors coming out of the inner decoder. The potential increase in bit errors coming out of the inner decoder is a result of using the sub-optimal decoder. However, because the processing requirements of the inner decoder account for a large percentage of the overall processing requirements a reduction in processing resulting from employing sub-optimal inner decoding can have a significant impact of the overall processing load.

Figure 3:
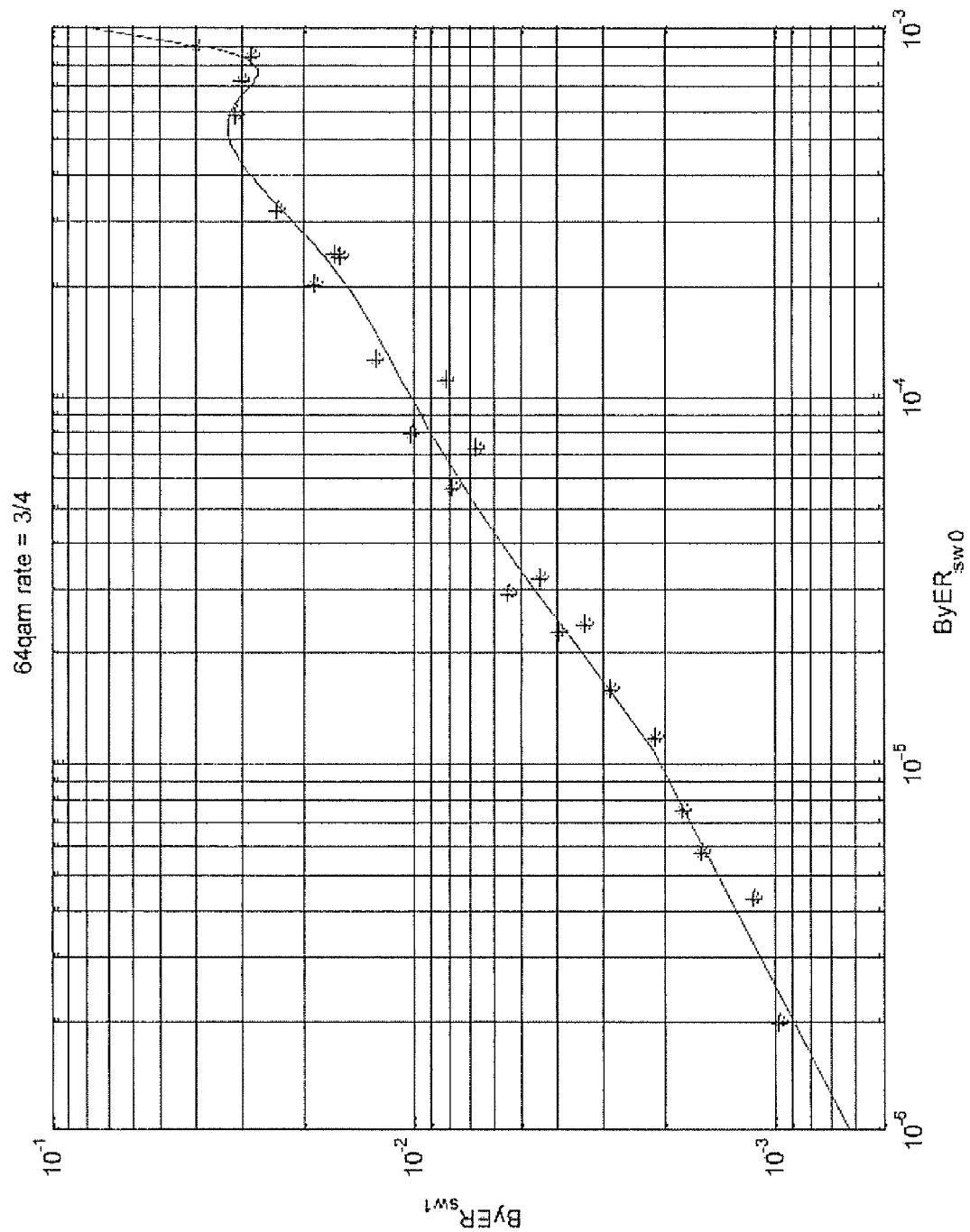
FIG. 3 is a graph depicting the relationship between byte error rate (ByER) measurements for optimal and sub-optimal inner decoders.

With reference to FIG. 3, a relationship between $ByER_{sw0}$ and $ByER_{sw1}$ is shown and described. As shown, the relationship between $ByER_{sw0}$ and $ByER_{sw1}$ is modulation and code-rate dependent. FIG. 3 shows this relation for modulation of 64QAM and an inner code-rate of ¾. FIG. 3 is a plot of $ByER_{sw1}$ in sub-optimal mode versus $ByER_{sw0}$ in optimal mode. The result relate to a simulations for different channels and the results are shown as markers "*" in FIG. 3. The solid line represents best fit 6th order polynomial g(ByER). Of course, other modulation and code-rate combinations result in other polynomials.

As stated above, a computational cost estimate "C" can be used to determine whether to operate in sub-optimal mode. The following equations describe one example of how to compute the computational cost for optimal mode $C^O$ and sub-optimal mode $C^{SO}$. In the following equations, a subscript of id refers to inner decoding. In the equations, $C_{od}(b)$ refers to the computational cost for outer decoder for b number of corrected byte errors. Also, $C_{deint}$ denotes the computational cost of the deinterleaver 30.

The probability of having b byte errors in a block of $N_b$ bytes in switch position 0 can be calculated as $$P_{byte}^{sw0}(b) = \binom{Nb}{b} ByER_{sw0}^b \times (1 - ByER_{sw0})^{Nb-b}. \quad (2)$$

When sub-optimal and optimal modes are competitive, $ByER_{sw0}$ is very low. Therefore it is reasonable to approximate $$P_{byte}^{sw0}(b) \; as \; P_{byte}^{sw0}(b) \approx \begin{cases} 1 & \text{if } b = 0 \\ 0 & \text{otherwise.} \end{cases} \quad (3)$$

Average computational cost for optimal mode, $C^O$, can be calculated as $$C^O = \sum_{b=0}^{b=Nb} (C_{id}^0 + C_{deint} + C_{od}(b)) \times P_{byte}^{sw0}. \quad (4)$$

Thus using equation (2) from above $C^O(ByER_{sw0})$ can be written as $$C^O(ByER_{sw0}) = \sum_{b=0}^{b=Nb} \begin{pmatrix} C_{id}^0 + \\ C_{deint} + \\ C_{od}(b) \end{pmatrix} \times \binom{Nb}{b} ByER_{sw0}^b \times (1 - ByER_{sw0})^{Nb-b}. \quad (5)$$

Using polynomial $g(ByER_{sw1})$ and equation (5) from above, $C^O(ByER_{sw1})$ can be written as $$C^O(ByER_{sw1}) = \quad (6)$$

$$\sum_{b=0}^{b=Nb} \begin{pmatrix} C_{id}^0 + \\ C_{deint} + \\ C_{od}(b) \end{pmatrix} \times \binom{Nb}{b} g(ByER_{sw1})^b \times (1 - g(ByER_{sw1}))^{Nb-b}.$$

The probability of having byte errors in a block of $N_b$ bytes when the selector 18 is in position 1 can be calculated as $$P_{byte}^{sw1}(b) = \binom{Nb}{b} ByER_{sw1}^b \times (1 - ByER_{sw1})^{Nb-b}. \quad (7)$$

The average computational cost for running sub-optimal decoder from equation (7) and equation (3) is calculated as $$C^{so} = \sum_{b=0}^{b=B} (C_{id}^{so} + C_{deint} + C_{od}(b)) \times P_{byte}^{sw1}(b) + \quad (8)$$

$$\begin{pmatrix} C_{id}^{so} + D \times C_{id}^0 + \\ (D+1) \times C_{deint} + \\ C_{od}(B+1) + C_{od}(0) \end{pmatrix} \times \sum_{b=B+1}^{Nb} P_{byte}^{sw1}(b).$$

From equation (7), $C^{so}(ByER_{sw1})$ can be written as $$C^{so}(ByER_{sw1}) = \quad (9)$$

$$\sum_{b=0}^{b=B} (C_{id}^{so} + C_{deint} + C_{od}(b)) \times \binom{Nb}{b} ByER_{sw1}^b \times (1 - ByER_{sw1})^{Nb-b} +$$

$$(C_{id}^{so} + D \times C_{id}^0 + (D+1) \times C_{deint} + C_{od}(B+1) + C_{od}(0)) \times$$

$$\sum_{b=B+1}^{Nb} \binom{Nb}{b} ByER_{sw1}^b \times (1 - ByER_{sw1})^{Nb-b}.$$

Using polynomial g(ByER$_{sw0}$) and equation (9) from above, C$^{SO}$(ByER$_{sw0}$) can be written as $$C^{SO}(ByER_{sw0}) = \sum_{b=0}^{b=B}(C_{id}^{so} + C_{deint} + C_{od}(b)) \times \binom{Nb}{b} g(ByER_{sw0})^b \times$$

$$(1 - g(ByER_{sw0}))^{Nb-b} + \begin{pmatrix} C_{id}^{so} + D \times C_{id}^0 + (D+1) \times \\ C_{deint} + C_{od}(B+1) + C_{od}(0) \end{pmatrix} \times$$

$$\sum_{b=B+1}^{Nb} \binom{Nb}{b} g(ByER_{sw0})^b \times (1 - g(ByER_{sw0}))^{Nb-b}$$

Figure 4:
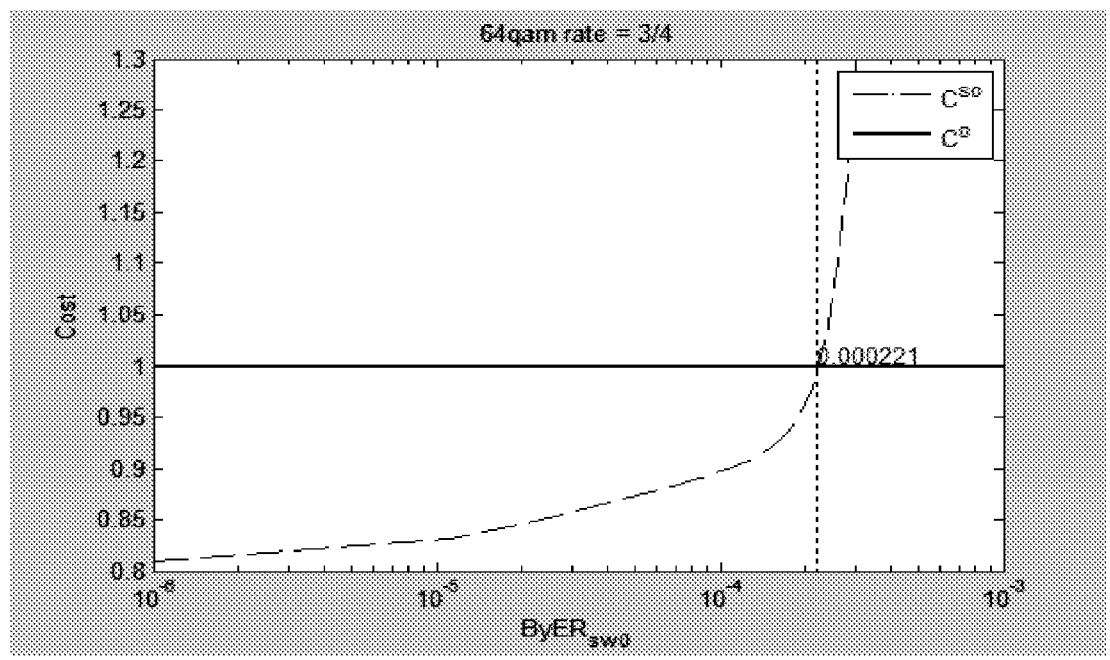
FIG. 4 is a graph depicting the computational cost for sub-optimal and optimal decoding versus ByER for optimal decoding.
Figure 5:
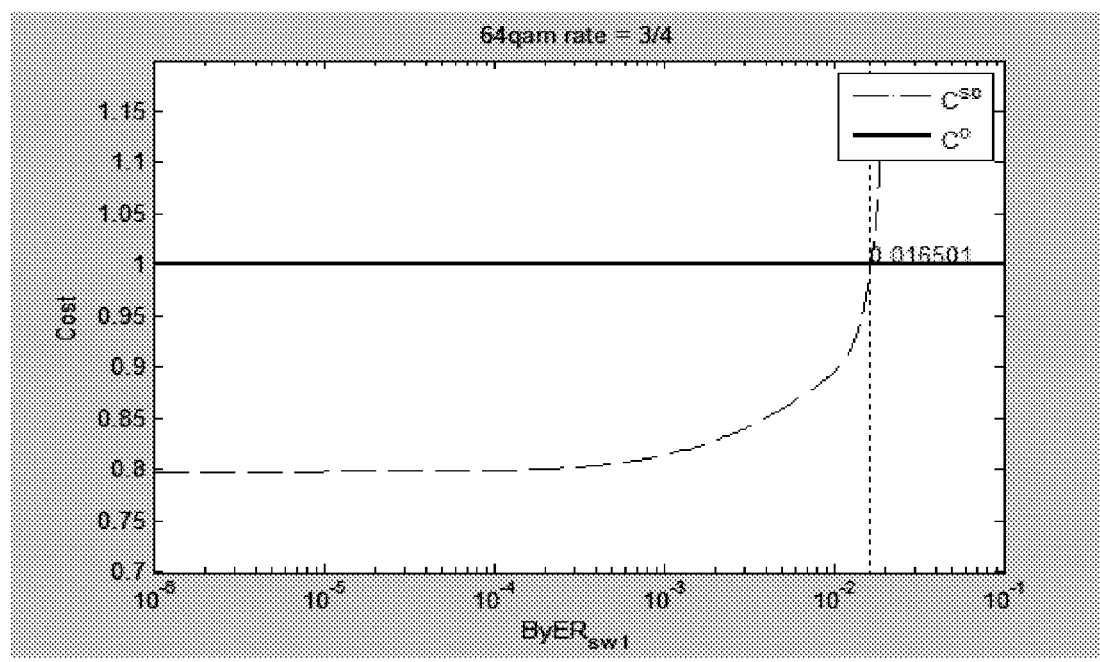
FIG. 5 is a graph depicting the computational cost for sub-optimal and optimal decoding versus ByER for sub-optimal decoding.

Using the above equations, the relationship between operating in either optimal mode or sub-optimal mode can be defined and used to determine whether to operate in sub-optimal mode. This relationship is evident from FIG. 4 and FIG. 5. FIG. 4, presents the computational cost in sub-optimal mode, denoted by C$^{SO}$, and optimal mode, denoted by C$^O$, versus byte error rate in optimal mode, ByER$_{sw0}$. FIG. 4 can be generated by calculating ByER$_{sw1}$ from ByER$_{sw0}$ using the polynomial P(ByER), and C$^{SO}$ is calculated from ByER$_{sw1}$. FIG. 5 depicts C$^{SO}$ and C$^O$ versus ByER$_{sw1}$. In both FIG. 4 and FIG. 5, the costs are normalized to C$^O$. Further C$^O$ is assumed to be the one at no errors (this favors the optimal mode but the effect is negligible in the region of interest).

Using the above, monitoring the error statistics provides the ability to accurately predict in both modes of operations whether the other mode offers a lower computational load. Fast switching between modes can respond well to varying channel conditions. In either mode output error performance is substantially uncompromised.

After determining that sub-optimal inner decoding is acceptable, the system 10 applies sub-optimal inner decoding to data received from the buffer 14. By way of example, assume switch is in position 0 when the system 10 begin decoding. After a certain period of time, a measurement is taken based on the output of outer decoder 34 and a decision whether to transition the selector 18 position 1 is given. For example, if the corrected number of errors by outer decoder 34 during a period of time is less than a threshold, switch position can be changed to 1. Here, based on the corrected number of errors, it is estimated that sub-optimal decoder can handle the decoding at a lower computation load. Thus, the selector 18 is transitioned and sub-optimal inner decoding is applied to subsequent data.

Referring back to FIG. 2, the method 200 also includes detecting (step 240) any errors at the output of the outer decoder 34. An error at the output of the outer decoder 34 can result when the number of corrections required of the outer decoder 34 exceeds a threshold. Said another way, when the output of the inner decoder 22, 26 results in a ByER that exceeds a specific number the outer decoder is unable to correctly decode the data. When a RS decoder is the outer decoder 34, the RS decoder provides an indication of an error event which is recognizable by the processor performing the decoding. One cause of such performance degradation can be changes to the channel conditions between the transmitting and receiving parties.

After experiencing an error, the method 200 recodes (step 250) the blocks of data that resulted in the error at the outer decoder 34. Recall the buffer 14 is sized appropriately to account of the delay of certain components of the system 10. The size of the buffer 14, in one examples, is equal to the sum of the delays for deinterleaver 30 and inner decoder 22, 26.

Convolutional deinterleavers with a delay of more than one decoding block are commonly used for these schemes. The total delay for deinterleaver 30 and sub-optimal inner decoder 26 is referenced by "D". The delay for inner decoder 22, 26 is commonly less than a block. Assume, for this example, and for the ease of implementation that the delay for inner decoder 22, 26 is one block. In this case block number "n" at the input of outer decoder 34 has data from blocks numbered n−D+1 to number n at the input of inner decoder 22, 26. Therefore, if a decoding failure is indicated by outer decoder 34 with selector 18 in position 1, the selector 18 position is changed to 0 and optimal inner decoder 22 runs for block numbers from n−D+1 to number n that reside in the buffer 14.

Said another way, the buffer 14 stores a certain number of data blocks for a specific time period. Thus, when an error at the output of the outer decoder 34 occurs those blocks that caused the error can be retrieved from the buffer 14 and redecoded using the optimal inner decoder 22. This temporary shift to optimal decoding for the purposes of redecoding certain data blocks helps to ensure that the overall error performance is uncompromised.

FIGS. 6 and 7 provide functional block diagram illustrations of general purpose computer hardware platforms. FIG. 6 illustrates a network or host computer platform, as may typically be used to implement a server. FIG. 7 depicts a computer with user interface elements, as may be used to implement a personal computer (PC) or other type of work station or terminal device, although the computer of FIG. 7 may also act as a server if appropriately programmed. It is believed that those skilled in the art are familiar with the structure, programming and general operation of such computer equipment and as a result the drawings should be self-explanatory.

The hardware elements, operating systems and programming languages of such computers are conventional in nature, and it is presumed that those skilled in the art are adequately familiar therewith. Of course, the server functions may be implemented in a distributed fashion on a number of similar platforms, to distribute the processing load.

Hence, aspects of the methods of serial concatenated decoding outlined above may be embodied in programming. Program aspects of the technology may be thought of as "products" or "articles of manufacture" typically in the form of executable code and/or associated data that is carried on or embodied in a type of machine readable medium. "Storage" type media include any or all of the memory of the computers, processors or the like, or associated modules thereof, such as various semiconductor memories, tape drives, disk drives and the like, which may provide storage at any time for the software programming. All or portions of the software may at times be communicated through the Internet or various other telecommunication networks. Such communications, for example, may enable loading of the software from one computer or processor into another, for example, from a management server or host computer of the network operator or carrier into the computer platform of the data aggregator and/or the computer platform(s) that serve as the customer communication system. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to tangible "storage" media, terms such as computer or machine "readable medium" refer to any medium that participates in providing instructions to a processor for execution.

Hence, a machine readable medium may take many forms, including but not limited to, a tangible storage medium, a carrier wave medium or physical transmission medium. Non-volatile storage media include, for example, optical or magnetic disks, such as any of the storage devices in any computer(s) or the like, such as may be used to implement the data aggregator, the customer communication system, etc. shown in the drawings. Volatile storage media include dynamic memory, such as main memory of such a computer platform. Tangible transmission media include coaxial cables; copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a PROM and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

Those skilled in the art will recognize that the present teachings are amenable to a variety of modifications and/or enhancements. For example, although the above examples related to decoding in a television broadcasting environment the benefits described herein are equally applicable to radio broadcasts, cellular communications, and other communications systems where serial concatenated decoding is used. Also, although two inner decoders are shown, more than two can be used. Thus, a varying degrees of processor load reductions can be achieved.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A method of performing serial concatenated decoding having inner decoding and outer decoding, the method comprising the steps of:
   monitoring a measure of the number of corrections made to a plurality of data blocks during outer decoding;
   determining, in response to the measure of the number of corrections, whether applying sub-optimal inner decoding would reduce a computational load experienced by a processor performing both the inner decoding and the outer decoding of the serial concatenated decoding when compared to the computation load experienced by the processor performing both the inner decoding and the outer decoding of the serial concatenated decoding when optimal inner decoding is applied; and
   applying, by the processor, sub-optimal inner decoding on data being serially concatenated decoded when the determination indicates that the computational load experienced is reduced.

2. The method of claim 1 further comprising temporarily applying optimal inner decoding to a portion of the plurality of data blocks previously decoded with the sub-optimal decoding, in response to an indication that an output of the outer decoding contains an error.

3. The method of claim 1 wherein monitoring a measure of the number of corrections made to a plurality of blocks of data by the outer decoding comprises monitoring the byte error rate of an output of the inner decoding.

4. The method of claim 1 wherein outer decoding comprises applying a Reed-Solomon decoding algorithm.

5. The method of claim 1 further comprising deinterleaving, prior to outer decoding, a result of the inner decoding.

6. The method of claim 1 wherein applying optimal inner decoding comprises applying a sixty-four state Viterbi decoding.

7. The method of claim 1 wherein applying sub-optimal inner decoding comprises applying a thirty-two state Viterbi decoding.

8. The method of claim 1 wherein applying optimal inner decoding comprises applying a log-MAP turbo decoding algorithm.

9. The method of claim 1 wherein applying sub-optimal inner decoding comprises applying a max-log-MAP turbo decoding algorithm.

10. The method of claim 1 wherein applying sub-optimal inner decoding comprises applying a LDPC decoding having a reduced number of iterations when compared to the number of iterations of optimal LDPC inner decoding.

11. A system for serial concatenated decoding, the system comprising:
    a selector having an input and a plurality of outputs;
    an optimal inner decoder having an output and an input in communication with a first selector output;
    a sub-optimal inner decoder having an output and an input in communication with a second selector output; and
    an outer decoder in communication with the output of each of the optimal inner decoder and sub-optimal inner decoder, the outer decoder having an output in communication with the selector that determines whether the optimal inner decoder or sub-optimal inner decoder receives data for decoding based on monitoring a measure of the number of corrections made to a plurality of blocks of data during operation of the outer decoder.

12. The system of claim 11 further comprising a buffer having an output in communication with the input of the selector.

13. The system of claim 11 further comprising a deinterleaver in communication with the outputs of each of the optimal inner decoder and sub-optimal inner decoder to receive the output of the inner decoders and also in communication with the outer decoder.

14. The system of claim 11 wherein the optimal inner decoder comprises a sixty-four state Viterbi decoder and the sub-optimal inner decoder comprises a thirty-two state Viterbi decoder.

15. The system of claim 11 wherein the outer decoder comprises a Reed-Solomon decoder.

16. The system of claim 11 wherein the optimal inner decoder comprises log-MAP turbo decoder and the sub-optimal inner decoder comprises a max-log-MAP turbo decoder.

17. The system of claim 11 wherein the optimal inner decoder comprises an LDPC decoder and the sub-optimal inner decoder comprises an LDPC decoder that implements fewer iterations than the optimal inner decoder.

18. The system of claim 11 wherein the output of the outer decoder controls whether optimal inner decoding is used to redecode at least a portion of the plurality of data blocks that were previously decoded using sub-optimal inner decoding when the output of the outer decoder contains an error.

19. An article of manufacture comprising:
a non-transitory machine readable storage medium; and
executable program instructions embodied in the machine readable storage medium that when executed by a programmable system causes the system to perform functions of serial concatenated decoding having inner decoding and outer decoding, the functions comprising:
monitoring a measure of the number of corrections made to a plurality of data blocks during outer decoding;
determining, in response to the measure of the number of corrections, whether applying sub-optimal inner decoding would reduce a computational load experienced by a processor of the programmable system performing both the inner decoding and the outer decoding of the serial concatenated decoding when compared to the computation load experienced by the processor performing both the inner decoding and the outer decoding of the serial concatenated decoding when optimal inner decoding is applied; and
applying, by the processor, sub-optimal inner decoding on data being serially concatenated decoded when the determination indicates that the computational load experienced is reduced.

20. The article of manufacture of claim 19 wherein the functions further comprise temporarily applying optimal inner decoding to a portion of the plurality of data blocks previously decoded with the sub-optimal decoding, in response to an indication that an output of the outer decoding contains an error.

21. The article of manufacture of claim 19 wherein the function of monitoring a measure of the number of corrections made to a plurality of blocks of data by the outer decoding comprises a function of monitoring the byte error rate of an output of the inner decoding.

22. The article of manufacture of claim 19 wherein the function of applying outer decoding comprises the function of applying a Reed-Solomon decoding algorithm.

23. The article of manufacture of claim 19 wherein the functions further comprise deinterleaving, prior to outer decoding, a result of the inner decoding.

24. The article of manufacture of claim 19 wherein the function of applying optimal inner decoding comprises applying a sixty-four state Viterbi decoding.

25. The article of manufacture of claim 19 wherein the function of applying sub-optimal inner decoding comprises applying a thirty-two state Viterbi decoding.

26. The article of manufacture of claim 19 wherein the function of applying optimal inner decoding comprises applying log-MAP turbo decoding algorithm.

27. The article of manufacture of claim 19 wherein the function of applying sub-optimal inner decoding comprises applying a max-log-MAP turbo decoding algorithm.

28. The article of manufacture of claim 19 wherein the function of applying sub-optimal inner decoding comprises applying a LDPC decoding having a reduced number of iterations when compared to the number of iterations of optimal LDPC inner decoding.

* * * * *